US012701838B2

(12) United States Patent
Hsu

(10) Patent No.: US 12,701,838 B2
(45) Date of Patent: Aug. 4, 2026

(54) LIGHT-EMITTING DIODE CIRCUIT SUBSTRATE AND MANUFACTURING METHOD THEREOF

(71) Applicant: Coretronic Corporation, Hsin-Chu (TW)

(72) Inventor: Chun-Chi Hsu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 490 days.

(21) Appl. No.: 17/702,807

(22) Filed: Mar. 24, 2022

(65) Prior Publication Data

US 2022/0320401 A1     Oct. 6, 2022

(30) Foreign Application Priority Data

Mar. 31, 2021     (CN) ......................... 202110349292.X

(51) Int. Cl.
*H10H 20/857*          (2025.01)
*H10H 20/01*           (2025.01)
(Continued)

(52) U.S. Cl.
CPC .......... *H10H 20/857* (2025.01); *H10H 20/01* (2025.01); *H10H 20/851* (2025.01);
(Continued)

(58) Field of Classification Search
CPC ..... H01L 33/00–648; H01L 27/15–156; H01L 2933/00–0091;
(Continued)

(56) References Cited

U.S. PATENT DOCUMENTS 12,033,995 B2      7/2024   Chung et al.
2008/0265781 A1   10/2008   Lin et al.
(Continued)

FOREIGN PATENT DOCUMENTS

CN          1870843        11/2006
CN          109755374       5/2019
(Continued)

OTHER PUBLICATIONS

Ettoday News, "Future TV is like a "jigsaw puzzle". Samsung's Micro LED technology allows screens to be combined at will", retrieved on Sep. 11, 2023, with English translation thereof. Available at: https://www.ettoday.net/news/20190107/1350083.htm.
(Continued)

*Primary Examiner* — Christine S. Kim
*Assistant Examiner* — Cole Leon Lindsey
(74) *Attorney, Agent, or Firm* — JCIPRNET

(57) ABSTRACT

A light-emitting diode circuit substrate including multiple light-emitting diode chips, a redistribution structure, and multiple bonding pads is provided. The light-emitting diode chips include multiple contacts. The redistribution structure is disposed on the light-emitting diode chips and in direct contact with the plurality of contacts. The plurality of bonding pads are disposed on the redistribution structure and electrically connected to the plurality of contacts of the light-emitting diode chips via the redistribution structure. A manufacturing method of the light-emitting diode circuit substrate is also provided.

7 Claims, 13 Drawing Sheets

10A

(51) Int. Cl.
　　*H10H 20/851* 　　　　(2025.01)
　　*H10W 90/00* 　　　　(2026.01)
(52) U.S. Cl.
　　CPC ........ *H10W 90/00* (2026.01); *H10H 20/0361*
　　　　　　(2025.01); *H10H 20/0364* (2025.01)
(58) Field of Classification Search
　　CPC ... H01L 21/768–76898; H01L 23/522–53295;
　　　　　　H01L 33/0095; H01L 24/00–98; H01L
　　　　　　25/0753; H01L 22/10–14; H10H 20/857;
　　　　　　H10H 29/49; H10H 29/857; H10H
　　　　　　29/922; H10H 29/942
　　See application file for complete search history.

(56) References Cited

U.S. PATENT DOCUMENTS

| | | | | |
|---|---|---|---|---|
| 2013/0280826 | A1* | 10/2013 | Scanlan ............. | H10W 74/014 |
| | | | | 438/15 |
| 2014/0190621 | A1* | 7/2014 | Kawata ............ | G02F 1/133351 |
| | | | | 156/155 |
| 2017/0328539 | A1* | 11/2017 | Huang ...................... | F21V 9/30 |
| 2017/0346011 | A1* | 11/2017 | Danesh .................... | G09G 3/32 |
| 2018/0052275 | A1 | 2/2018 | Lee et al. | |
| 2019/0393069 | A1* | 12/2019 | Paranjpe .................. | B32B 7/12 |
| 2020/0006610 | A1 | 1/2020 | Wang et al. | |
| 2020/0161518 | A1* | 5/2020 | Lin ...................... | H10H 20/857 |
| 2020/0313046 | A1 | 10/2020 | Tian et al. | |
| 2022/0149112 | A1 | 5/2022 | Hwang et al. | |
| 2022/0223576 | A1 | 7/2022 | Oh et al. | |
| 2022/0320401 | A1 | 10/2022 | Hsu | |

FOREIGN PATENT DOCUMENTS

| | | |
|---|---|---|
| CN | 208908220 | 5/2019 |
| CN | 210778585 | 6/2020 |
| CN | 115083990 | 9/2022 |
| CN | 115148887 | 10/2022 |
| JP | 2011044643 | 3/2011 |
| JP | 2013058520 | 3/2013 |
| TW | 202015269 | 4/2020 |
| TW | 202021058 | 6/2020 |
| TW | 202025112 | 7/2020 |
| TW | 202040279 | 11/2020 |
| TW | 202206911 | 2/2022 |

OTHER PUBLICATIONS

"Office Action of China Counterpart Application", issued on Mar. 26, 2025, p. 1-p. 8.

Feng; Jinfeng et al., "One Sand, One World One Book to Understanding Current Situation and Future of MEMS Industry", China Machine Press, Sep. 30, 2019, with English translation thereof, pp. 1-21.

"Office Action of China Counterpart Application", issued on Sep. 13, 2024, p. 1-p. 10.

"Office Action of US Related U.S. Appl. No. 18/465,999", issued on May 27, 2026, pp. 1-42.

\* cited by examiner

LIGHT-EMITTING DIODE CIRCUIT SUBSTRATE AND MANUFACTURING METHOD THEREOF

CROSS-REFERENCE TO RELATED APPLICATION

This application claims the priority benefit of China application serial no. 202110349292.X, filed on Mar. 31, 2021. The entirety of the above-mentioned patent application is hereby incorporated by reference herein and made a part of this specification.

BACKGROUND

Technical Field

The invention relates to a circuit substrate and a manufacturing method thereof, and particularly relates to a light-emitting diode (LED) circuit substrate and a manufacturing method thereof.

Description of Related Art

The conventional micro LED displays are generally manufactured by transferring multiple micro LED chips onto a circuit board via a mass transfer apparatus and fixing the micro LED chips to the circuit board by die bonding. However, the circuit board may have a manufacture tolerance, the mass transfer apparatus may have a positioning tolerance, and the die bonding process may have poor bonding problems. Taking a 4K UHD (3840×2160) micro LED display as an example, even if the yield rate is as high as 99.999%, the display may still have 248 defective pixels (stuck pixels or dead pixels). Based on the currently recognized display specification, a display should not have 12 or more stuck pixels or dead pixels. Therefore, the yield of mass transfer is key to the commercialization of micro LED displays.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The invention provides a manufacturing method of a light-emitting diode (LED) circuit substrate capable of facilitating the yield.

The invention also provides an LED circuit substrate with an increased yield.

Other objects and advantages of the invention can be further illustrated by the technical features broadly embodied and described as follows.

In order to achieve one or a portion of or all of the objects or other objects, an embodiment of the invention provides a manufacturing method of a light-emitting diode circuit substrate, including the following. A peelable layer is formed on a carrier plate. Multiple LED chips are disposed on the peelable layer. Multiple contacts of the LED chips are away from the peelable layer. Positions of the contacts of the LED chips disposed on the peelable layer are measured to obtain contact position data. An exposure circuit diagram is prepared according to the contact position data. A redistribution structure and multiple bonding pads are sequentially formed on the LED chips according to the exposure circuit diagram. The bonding pads are electrically connected with the contacts of the LED chips via the redistribution structure.

In order to achieve one or a portion of or all of the objects or other objects, an embodiment of the invention provides a light-emitting diode circuit substrate including multiple LED chips, a redistribution structure, and multiple bonding pads. The light-emitting diode chips include multiple contacts. The redistribution structure is disposed on the light-emitting diode chips and in direct contact with the contacts. The bonding pads are disposed on the redistribution structure and electrically connected to the contacts of the light-emitting diode chips via the redistribution structure.

Based on the above, the embodiments of the invention at least exhibit one advantage or effect of the following. In the embodiments of the invention, since the redistribution structure and the bonding pads are sequentially disposed on the LED chips, and the bonding pads are electrically connected with the contacts of the LED chips via the redistribution structure, a chip bonding process may be omitted and, as a result, the yield of transfer may be increased, the defective transfer resulting from the manufacture tolerance of the circuit substrate, the warpage of the circuit substrate, or the positioning tolerance of the mass transfer apparatus, etc., may be suppressed, or the device damage caused by a high-temperature reflow or post-bonding process may be alleviated.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
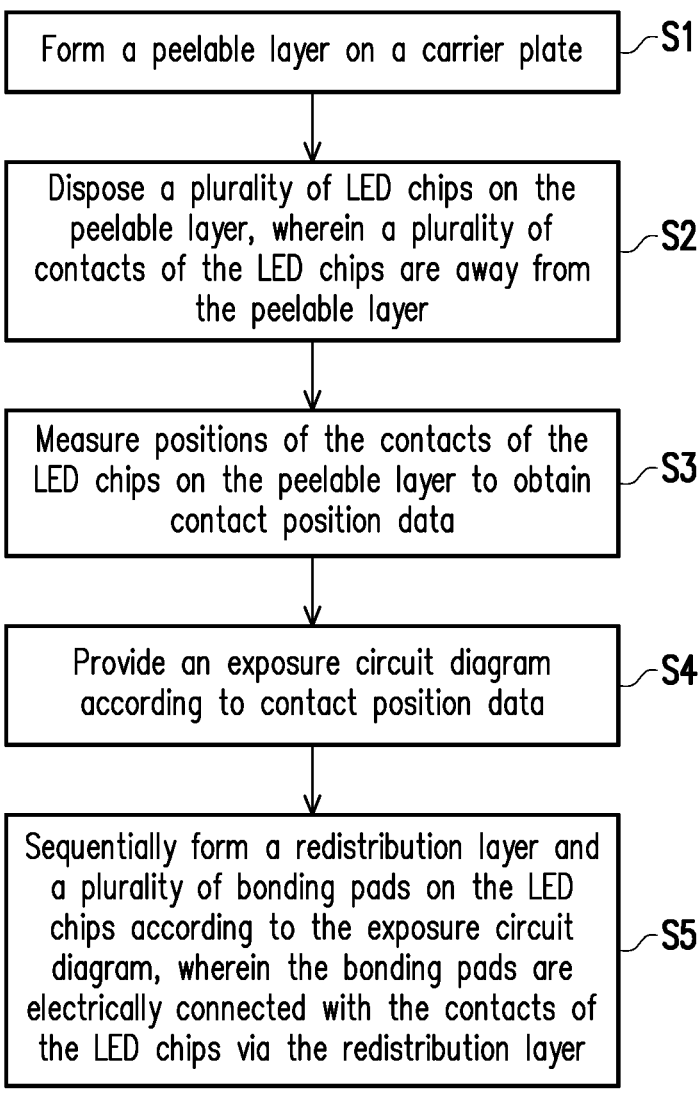
FIG. 1 is a flowchart illustrating a manufacturing method of a light-emitting diode (LED) circuit substrate according to an embodiment of the invention.
Figure 2A:
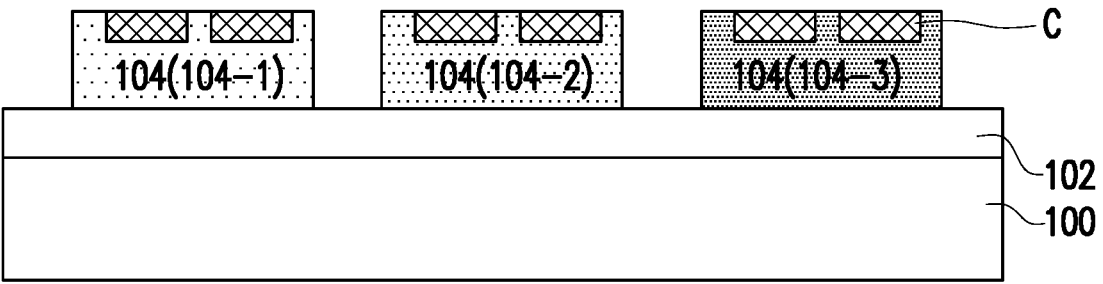
FIGS. 2A to 2W are schematic diagrams illustrating an example of the manufacturing method of the LED circuit substrate of FIG. 1.

FIG. 1 is a flowchart illustrating a manufacturing method of a light-emitting diode (LED) circuit substrate according to an embodiment of the invention. FIGS. 2A to 2W are schematic diagrams illustrating an example of the manufacturing method of the LED circuit substrate of FIG. 1. However, it should be understood that FIGS. 2A to 2W merely illustrate an example of the manufacturing method of the LED circuit substrate shown in FIG. 1, and shall not be construed as a limitation on the embodiments of the invention. People of ordinary skills in the art may add or remove one or more steps in FIGS. 2A to 2W based on needs without departing from the claimed scope.

Referring to FIGS. 1 and 2A, the manufacturing method of the LED circuit substrate may include forming a peelable layer 102 on a carrier plate 100 (Step S1). For example, the peelable layer 102 may be formed on the carrier plate 100 by coating. However, the invention is not limited thereto.

The carrier plate 100 is rigid to carry a device or a film/layer formed on the carrier plate 100. For example, the carrier plate 100 may be a glass substrate, a plastic substrate, a metal substrate, an alloy substrate, a ceramic substrate, a silicon substrate, a substrate of other types, or a combination thereof. In other words, the carrier plate 100 may be a single-layer plate or a composite plate.

The peelable layer 102 may be configured to temporarily fix devices (e.g., multiple LED chips 104) formed on the peelable layer 102 to the carrier plate 100. In addition, the peelable layer 102 may lose its adhesiveness under a preset condition. In this way, the devices (e.g., the LED chips 104) formed on the peelable layer 102 may be detached from the carrier plate 100. For example, the peelable layer 102 may include a light debonding layer (e.g., a UV light debonding adhesive) which loses its adhesiveness when being irradiated, a heat debonding layer which loses its adhesiveness when being heated, or a cold debonding layer which loses its adhesiveness when being cooled off. However, the invention is not limited thereto.

Referring to FIGS. 1 and 2A, the manufacturing method of the LED circuit substrate may further include disposing multiple LED chips 104 on the peelable layer 102, wherein a plurality of contacts C of the LED chips 104 may be away from the peelable layer 102 (Step S2). For example, by multiple mass transfer processes, the LED chips 104 may be transferred onto the peelable layer 102, with the contacts C of the LED chips 104 being away from the peelable layer 102. In other words, after the LED chips 104 are transferred onto the peelable layer 102, the contacts C are located on a side of the LED chips 104 away from the peelable layer 102. The LED chips 104 may include multiple micro LEDs or multiple mini LEDs. However, the invention is not limited thereto.

In some embodiments, the LED chips 104 may include LED chips of multiple colors, such as multiple red LED chips 104-1 (only one red LED chip 104-1 shown in FIG. 2A for schematic illustration), multiple green LED chips 104-2 (only one green LED chip 104-2 shown in FIG. 2A for schematic illustration), and multiple blue LED chips 104-3 (only one blue LED chip 104-3 shown in FIG. 2A for schematic illustration). However, the invention is not limited thereto. In other embodiments, the multiple LED chips 104 may be LED chips of the same color. The multiple LED chips of each color may be transferred onto the peelable layer 102 by two times mass transfer processes, for example. For example, the red LED chips 104-1 (or the green LED chips 104-2 or the blue LED chips 104-3) may be transferred from a growth substrate (not shown) onto a temporary substrate by a first time mass transfer process, and then transferred from the temporary substrate onto the peelable layer 102 by a second time mass transfer process. Of course, the number times of mass transfer processes for transferring the LED chips onto the peelable layer 102 is not particularly limited in the invention.

Figure 2B:
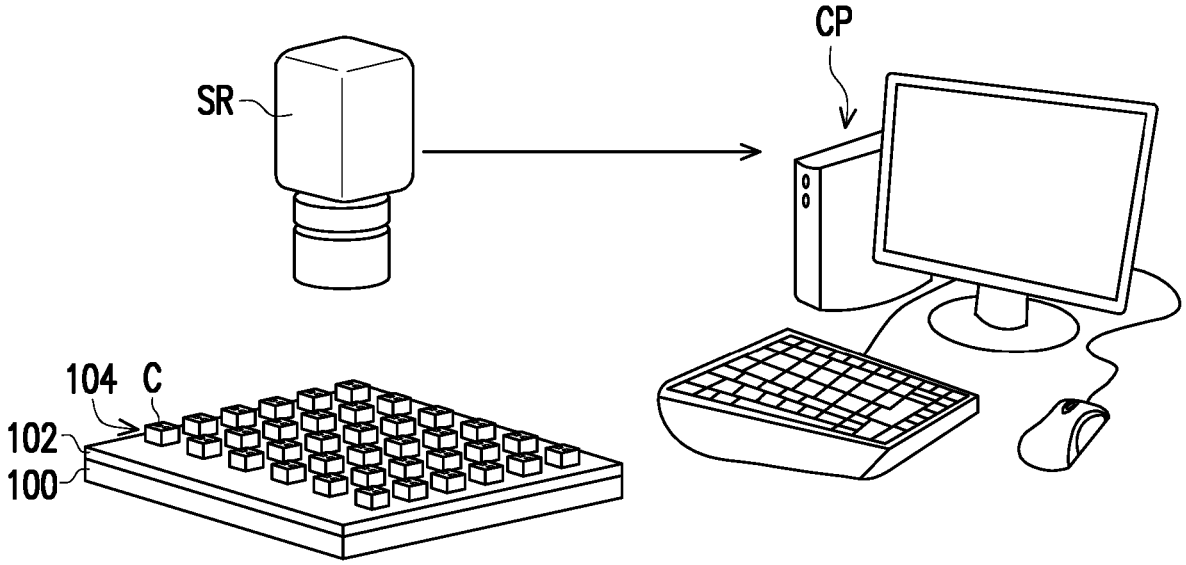

Referring to FIGS. 1 and 2B, the manufacturing method of the LED circuit substrate may further include measuring positions of the contacts C of the LED chips 104 disposed on the peelable layer 102 to obtain contact position data (Step S3). The positions of the contacts may be measured in a contacted or contactless manner. Taking contactless measurement as an example, the image of the LED chips 104 may be captured by using an image sensor SR (e.g., camera), and then a processor may perform image processing and analysis on the image captured by the image sensor SR. Accordingly, the contact position data including the positions of the contacts C may be obtained. The processor may be coupled to the image sensor SR via a physical line or a wireless network, so as to obtain the image captured by the image sensor SR. The processor may include a central processing unit (CPU) or a graphic processing unit (GPU). However, the invention is not limited thereto. In addition, the processor may be built in a computer CP, a mobile device (not shown) or in a cloud device (not shown). However, the invention is not limited thereto.

Figure 2C:
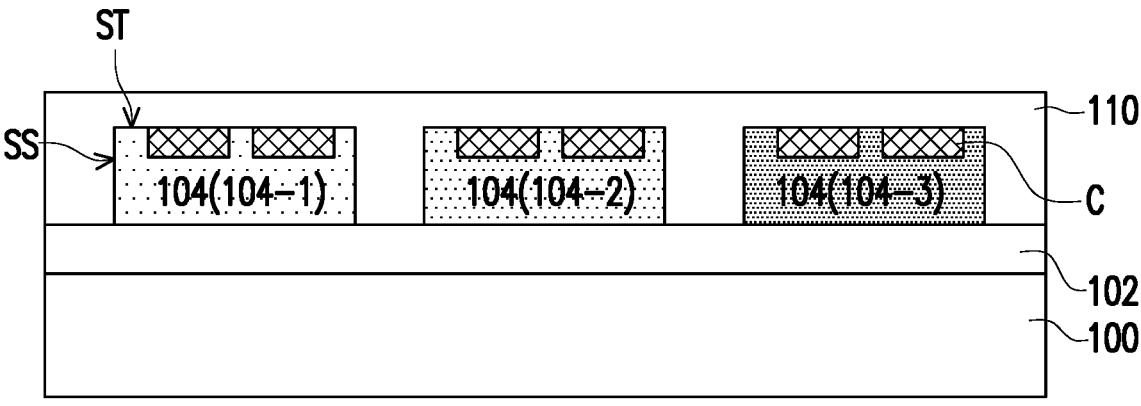

Referring to FIGS. 1 and 2B, the manufacturing method of the LED circuit substrate may further include preparing and providing an exposure circuit diagram according to the contact position data (Step S4). Specifically, in the subsequent processes, multiple exposure steps/processes are required to form a redistribution structure 106 and multiple bonding pads 108 on the LED chips 104, as shown in FIGS. 2C to 2W. Before the exposure processes, the image captured by the image sensor SR in Step S3 may be used to obtain relevant data (e.g., contact position data, contact size data, contact interval data, etc.,) of the contacts C. The exposure circuit diagram may be prepared and provided according to relevant data of the contacts C and loaded into an exposure machine (not shown) to carry out the exposure processes.

In some embodiments, the exposure machine may be a maskless exposure machine. That is, the redistribution structure 106 and the bonding pads 108 may be formed on the LED chips 104 by a maskless photolithography process. However, the invention is not limited thereto. The maskless exposure machine may include a light source module, a microlens array, and a projection lens, etc. However, the invention is not limited thereto. In some embodiments, the microlens array may be replaced by a spatial filter or a digital micro mirror device (DMD). However, the invention is not limited thereto. In other embodiments, the exposure machine may be an exposure machine using a mask.

In some embodiments, after the contact position data is obtained and before the redistribution structure 106 and the bonding pads 108 are formed, the manufacturing method of the LED circuit substrate may further include conducting an electrical test on the LED chips 104. If any defective LED chip 104 is found, the defective LED chip 104 may be fixed or replaced. By doing so, the overall yield is facilitated.

Referring to FIGS. 1 and 2C to 2W, the manufacturing method of the LED circuit substrate may further include sequentially forming the redistribution structure 106 and the bonding pads 108 on the LED chips 104 according to the exposure circuit diagram. The bonding pads 108 may be electrically connected with the contacts C of the LED chips 104 via the redistribution structure 106 (Step S5).

Referring to FIG. 2C, an insulating layer 110 is formed on the LED chips 104 and the peelable layer 102 exposed by the LED chips 104. The insulating layer 110, for example, covers a top surface ST and sidewall surfaces SS of each of the LED chips 104. For example, the material of the insulating layer 110 may include a photosensitive material with favorable temperature tolerance, such as photosensitive polyimide. However, the invention is not limited thereto. A process for forming the insulating layer 110 may include coating and baking. However, the invention is not limited thereto.

Figure 2D:
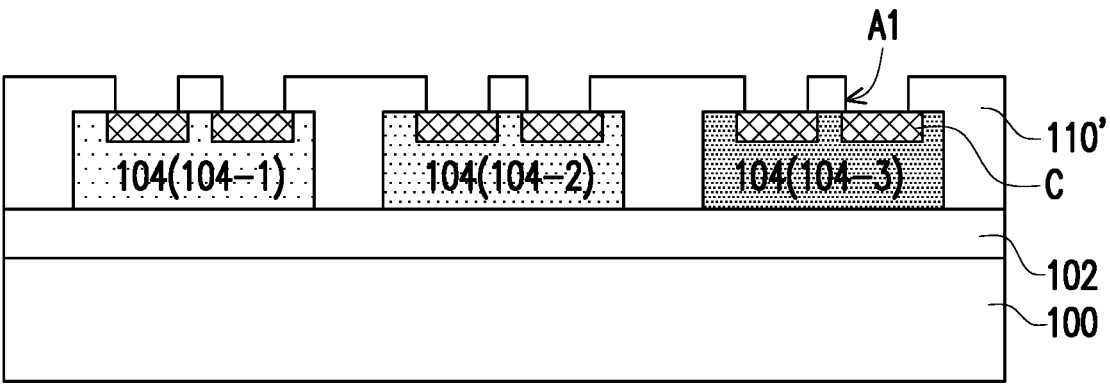

Referring to FIG. 2D, the insulating layer 110 is sequentially exposed, developed, and baked according to the exposure circuit diagram to form a patterned insulating layer 110'. The patterned insulating layer 110' has multiple openings A1. The openings A1 respectively expose the contacts C of the LED chips 104.

Figure 2E:
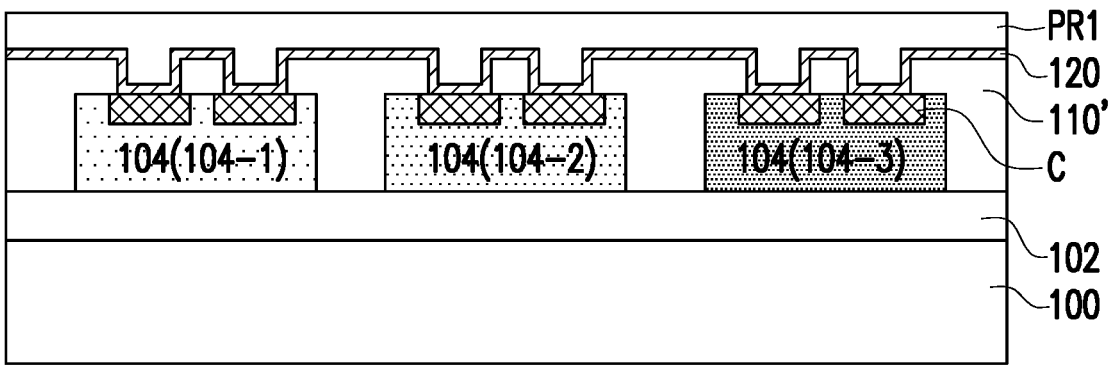

Referring to FIG. 2E, a conductive layer 120 and a photoresist layer PR1 are sequentially formed on the patterned insulating layer 110' and the contacts C. The material of the conductive layer 120 may include metal, alloy, or a combination thereof. A process for forming the conductive layer 120 may include evaporation. In addition, a process for forming the photoresist layer PR1 may include coating. However, the invention is not limited thereto.

Figure 2F:
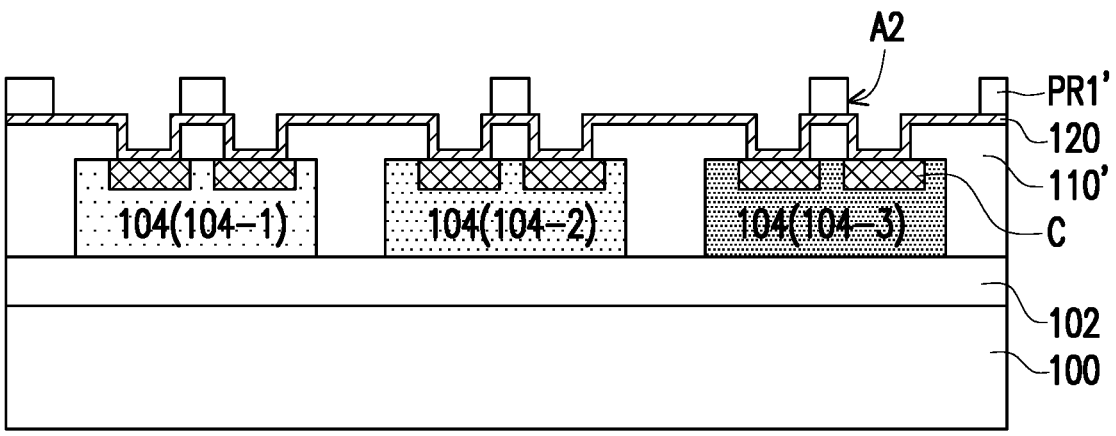

Referring to FIG. 2F, the photoresist layer PR1 is sequentially exposed, developed, and baked according to the exposure circuit diagram to form a patterned photoresist layer PR1'. The patterned photoresist layer PR1' has multiple openings A2. The openings A2 respectively expose multiple portions of the conductive layer 120.

Figure 2G:
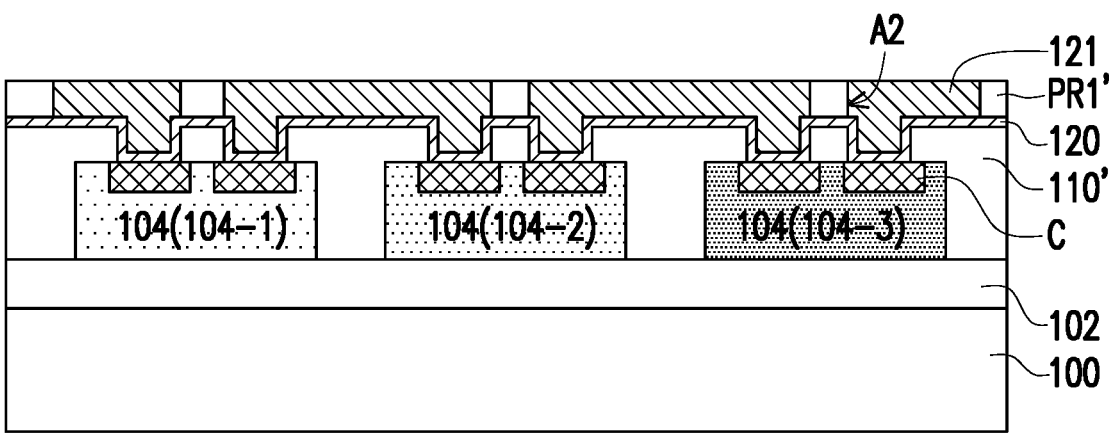

Referring to FIG. 2G, a conductive layer 121 is formed in the multiple openings A2. The material of the conductive layer 121 may include metal, alloy, or a combination thereof. A process for forming the conductive layer 121 may include electroplating. However, the invention is not limited thereto. Then, the patterned photoresist layer PR1' may be removed (FIG. 2H) by a demolding process.

Figure 2H:
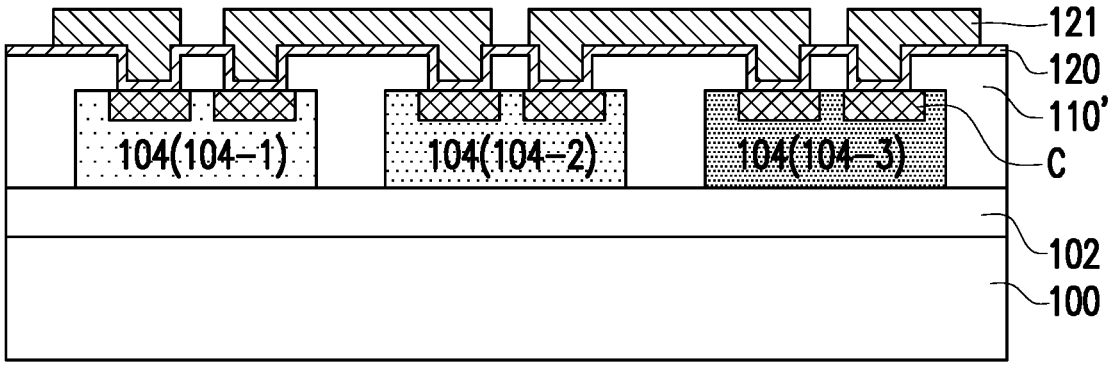
Figure 2I:
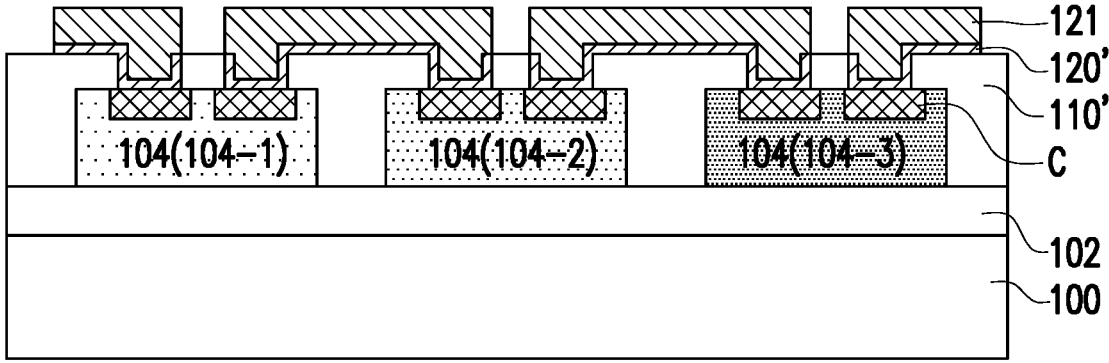

Referring to FIG. 2I, the conductive layer 120 of FIG. 2H is etched by using the conductive layer 121 as a mask, so as to remove the conductive layer 120 not covered by the conductive layer 121 and form a patterned conductive layer 120'.

Figure 2J:
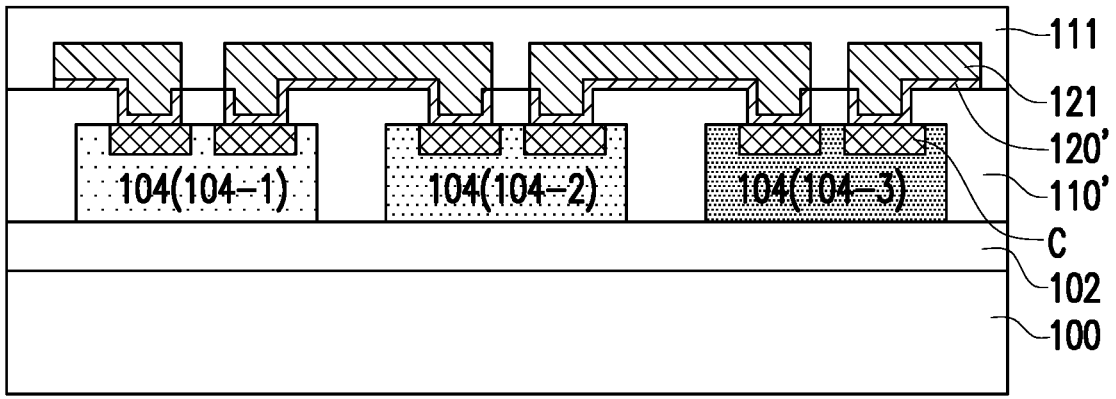

Then, referring to FIG. 2J, an insulating layer 111 is formed on the conductive layer 121 and the patterned insulating layer 110' exposed by the conductive layer 121. For example, the material of the insulating layer 111 may include a photosensitive material with favorable temperature tolerance, such as photosensitive polyimide. However, the invention is not limited thereto. A process for forming the insulating layer 111 may include coating and baking. However, the invention is not limited thereto.

Figure 2K:
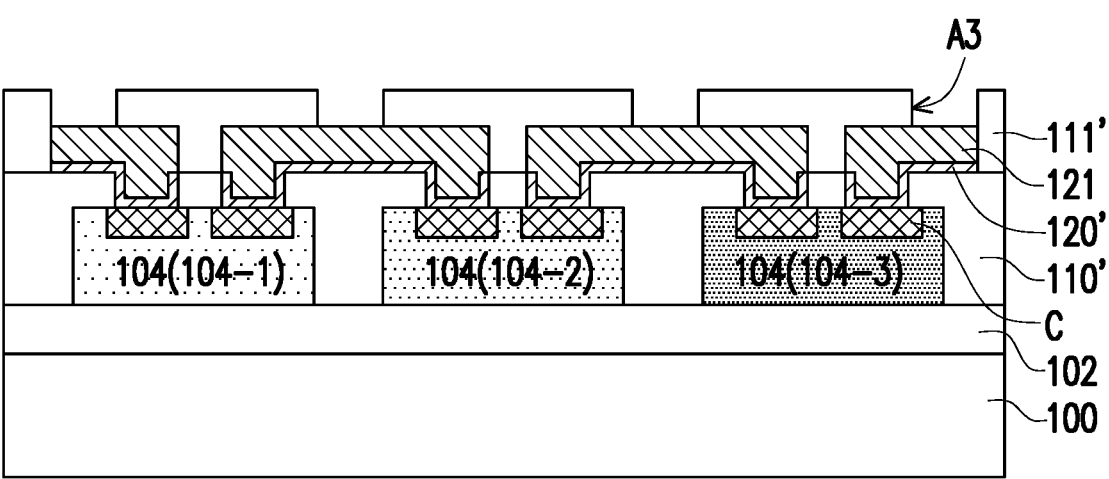

Referring to FIG. 2K, the insulating layer 111 is sequentially exposed, developed, and baked according to the exposure circuit diagram to form a patterned insulating layer 111'. The patterned insulating layer 111' has multiple openings A3. The openings A3 respectively expose multiple portions of the conductive layer 121.

Figure 2L:
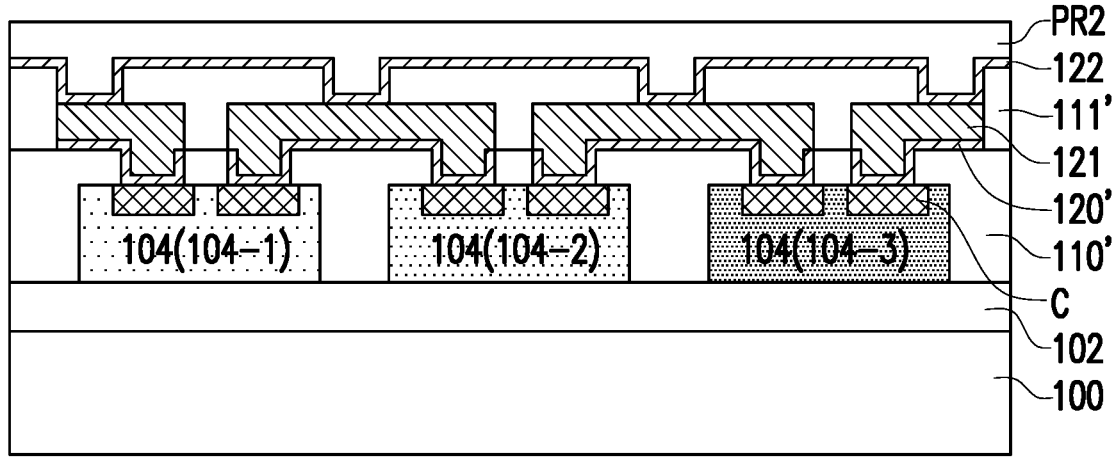

Referring to FIG. 2L, a conductive layer 122 and a photoresist layer PR2 are sequentially formed on the patterned insulating layer 111' and the multiple portions of the conductive layer 121. The material of the conductive layer 122 may include metal, alloy, or a combination thereof. A process for forming the conductive layer 122 may include evaporation. In addition, a process for forming the photoresist layer PR2 may include coating. However, the invention is not limited thereto.

Figure 2M:
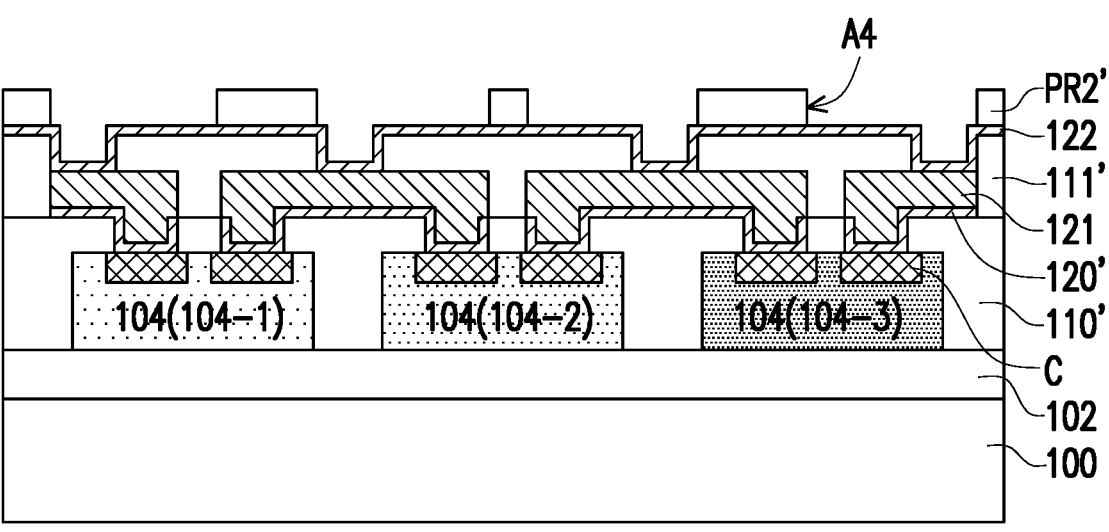

Referring to FIG. 2M, the photoresist layer PR2 is sequentially exposed, developed, and baked according to the exposure circuit diagram to form a patterned photoresist layer PR2'. The patterned photoresist layer PR2' has multiple openings A4. The openings A4 respectively expose multiple portions of the conductive layer 122.

Figure 2N:
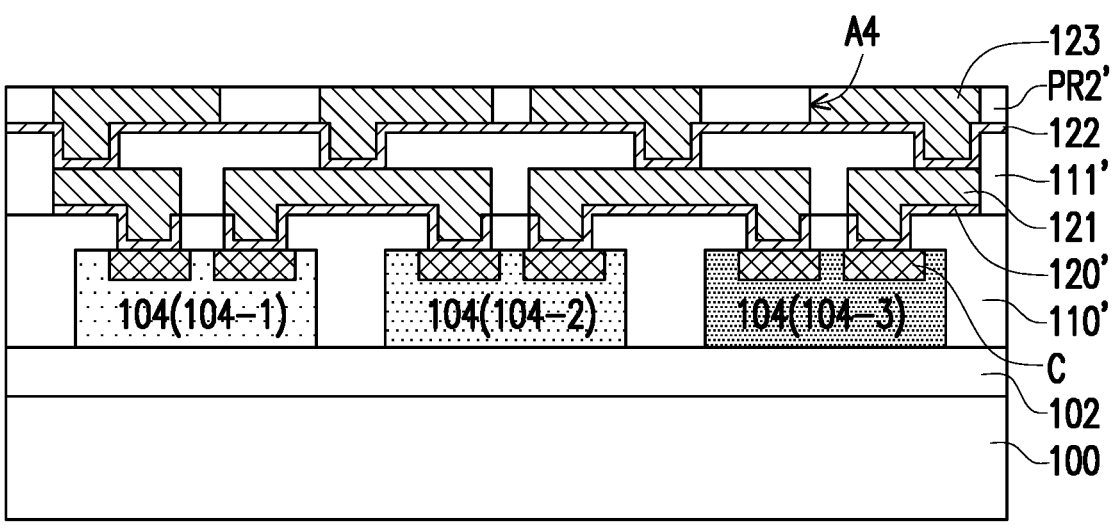

Referring to FIG. 2N, a conductive layer 123 is formed in the multiple openings A4. The material of the conductive layer 123 may include metal, alloy, or a combination thereof. A process for forming the conductive layer 123 may include electroplating. However, the invention is not limited thereto. Then, the patterned photoresist layer PR2' may be removed (FIG. 2O) by a demolding process.

Figure 2O:
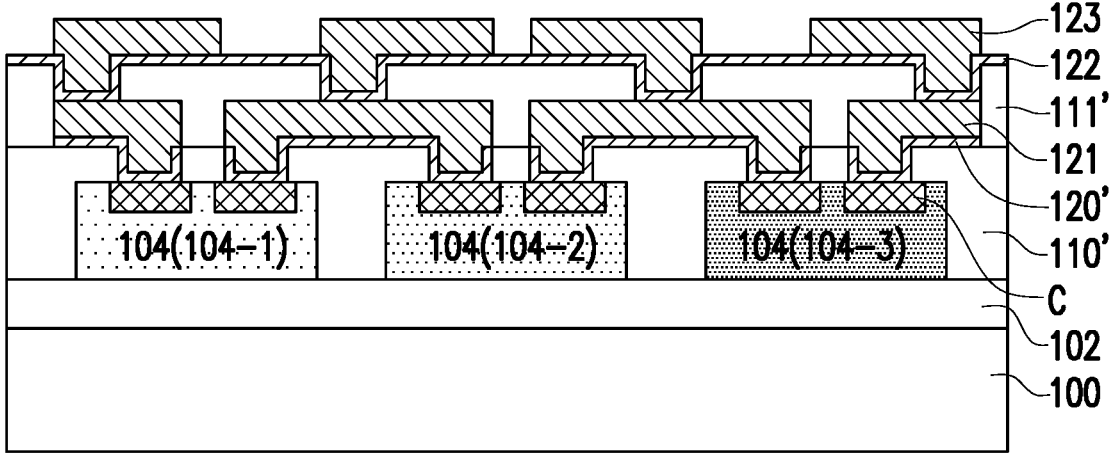
Figure 2P:
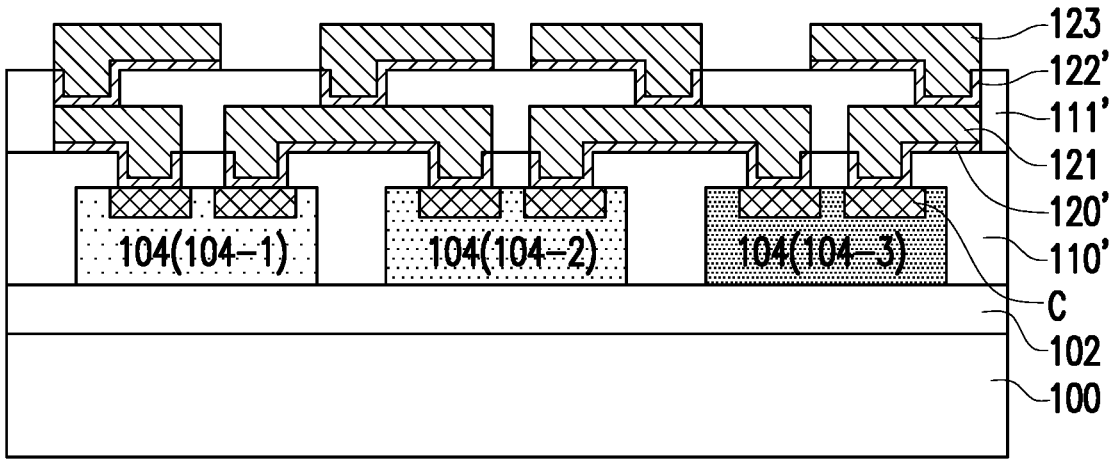

Referring to FIG. 2P, the conductive layer 122 of FIG. 2O is etched by using the conductive layer 123 as a mask, so as to remove the conductive layer 122 not covered by the conductive layer 123 and form a patterned conductive layer 122'.

Figure 2Q:
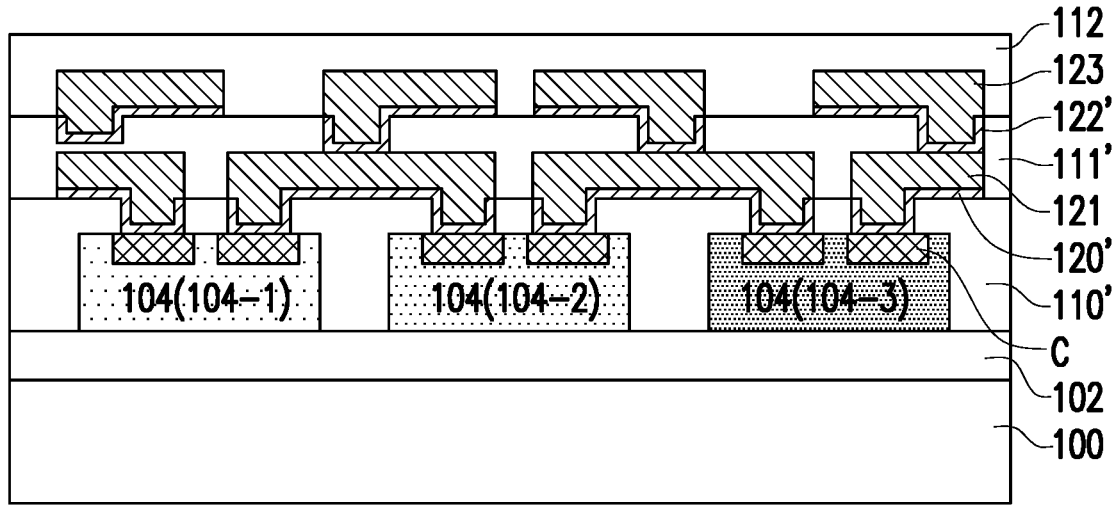

Referring to FIG. 2Q, an insulating layer 112 is formed on the conductive layer 123 and the patterned insulating layer 111' exposed by the conductive layer 123. For example, the material of the insulating layer 112 may include a photosensitive material with favorable temperature tolerance, such as photosensitive polyimide. However, the invention is not limited thereto. A process for forming the insulating layer 112 may include coating and baking. However, the invention is not limited thereto.

Figure 2R:
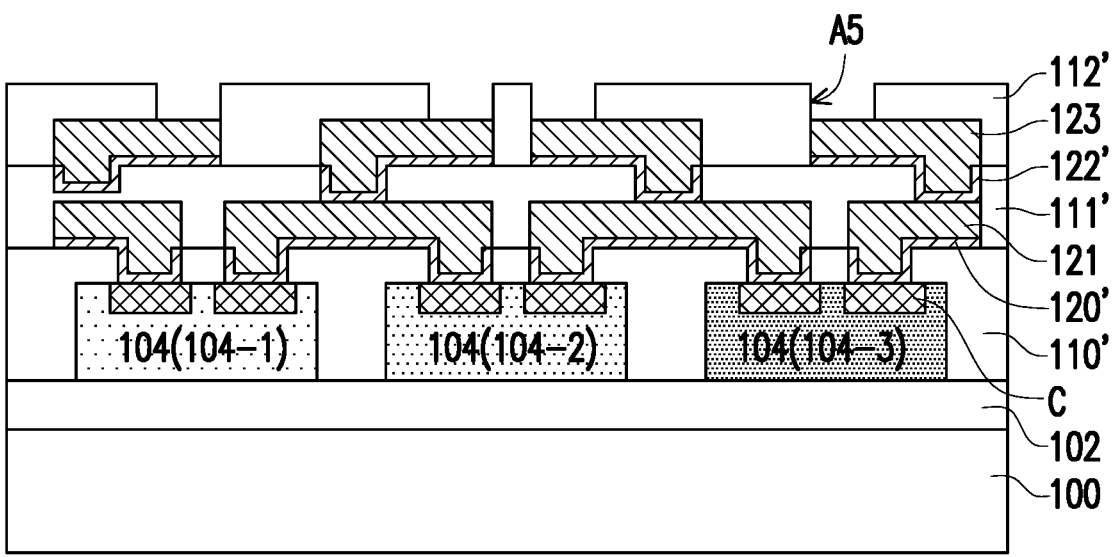

Referring to FIG. 2R, the insulating layer 112 is sequentially exposed, developed, and baked according to the exposure circuit diagram to form a patterned insulating layer 112'. The patterned insulating layer 112' has multiple openings A5. The openings A5 respectively expose multiple portions of the conductive layer 123.

Figure 2S:
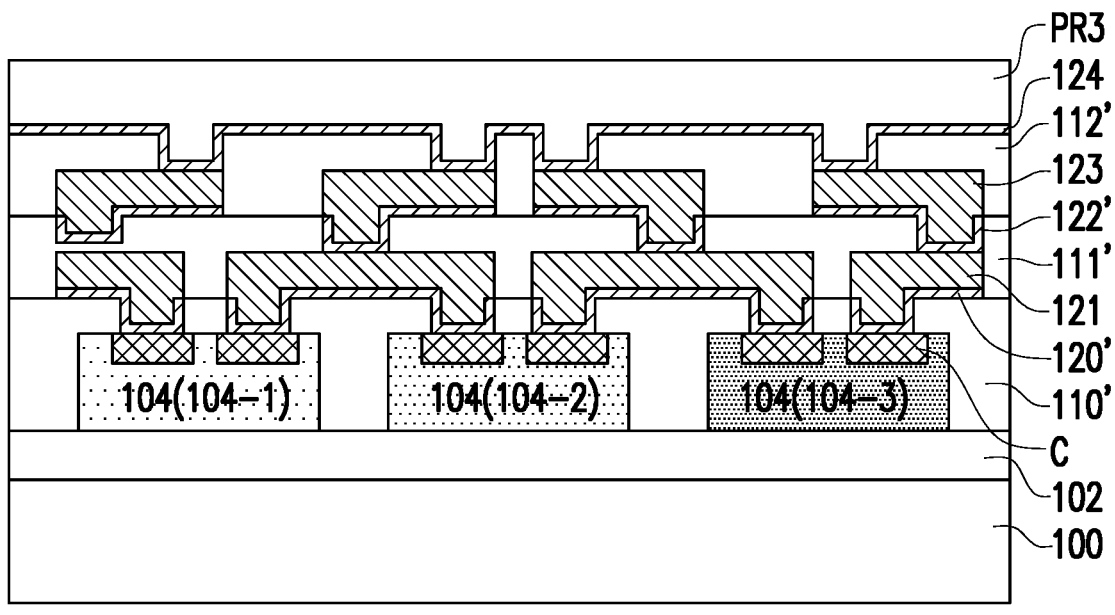

Referring to FIG. 2S, a conductive layer 124 and a photoresist layer PR3 are sequentially formed on the patterned insulating layer 112' and the multiple portions of the conductive layer 123. The material of the conductive layer 124 may include metal, alloy, or a combination thereof. A process for forming the conductive layer 124 may include evaporation. In addition, a process for forming the photoresist layer PR3 may include coating. However, the invention is not limited thereto.

Figure 2T:
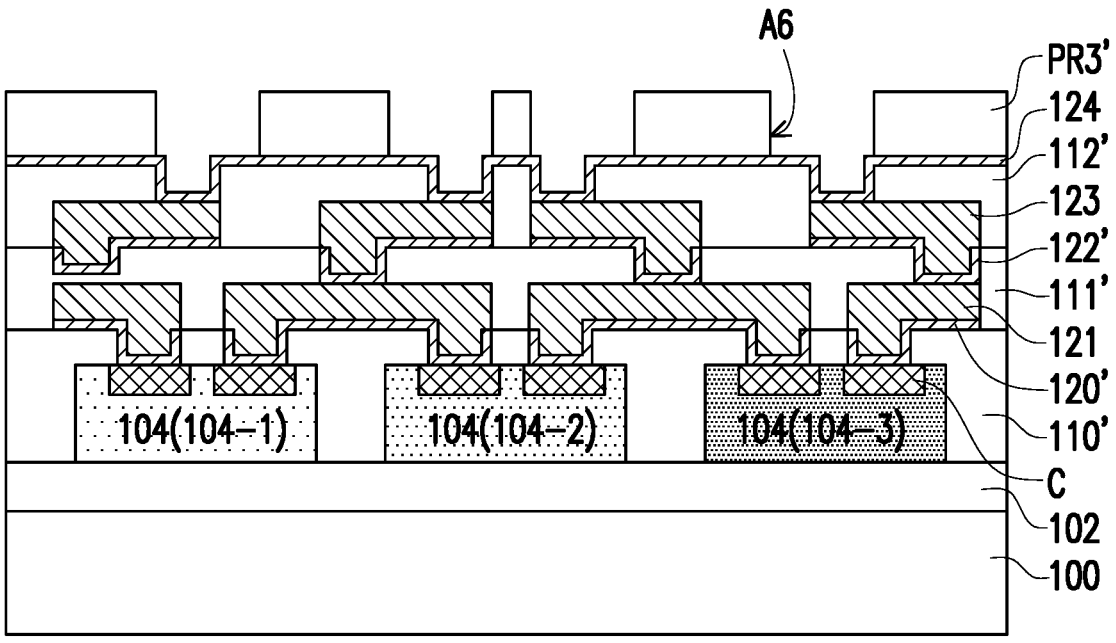

Referring to FIG. 2T, the photoresist layer PR3 is sequentially exposed, developed, and baked according to the exposure circuit diagram to form a patterned photoresist layer PR3'. The patterned photoresist layer PR3' has multiple openings A6. The openings A6 respectively expose multiple portions of the conductive layer 124.

Figure 2U:
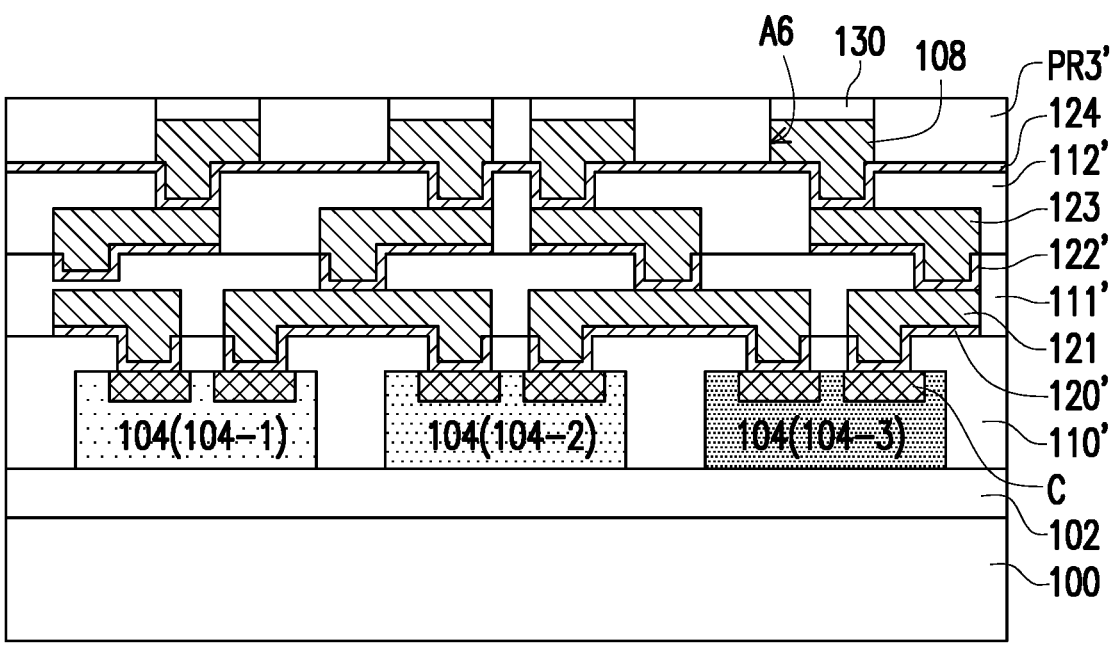

Referring to FIG. 2U, the bonding pads 108 and a protection layer 130 are sequentially formed in the openings A6. The material of the bonding pads 108 may include metal, alloy, or a combination thereof. The material of the protection layer 130 may include an anti-oxidation material, such as gold or nickel. However, the invention is not limited thereto. A process for forming the bonding pads 108 and the protection layer 130 may include electroplating. However, the invention is not limited thereto. Then, the patterned photoresist layer PR3' may be removed (FIG. 2V) by a demolding process.

Figure 2V:
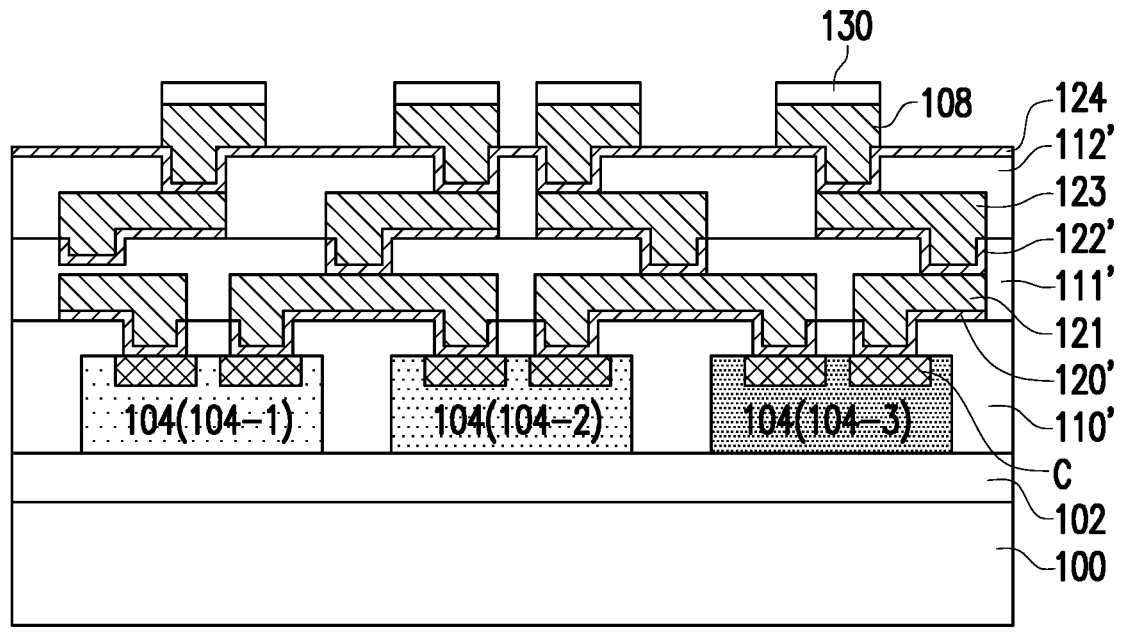
Figure 2W:
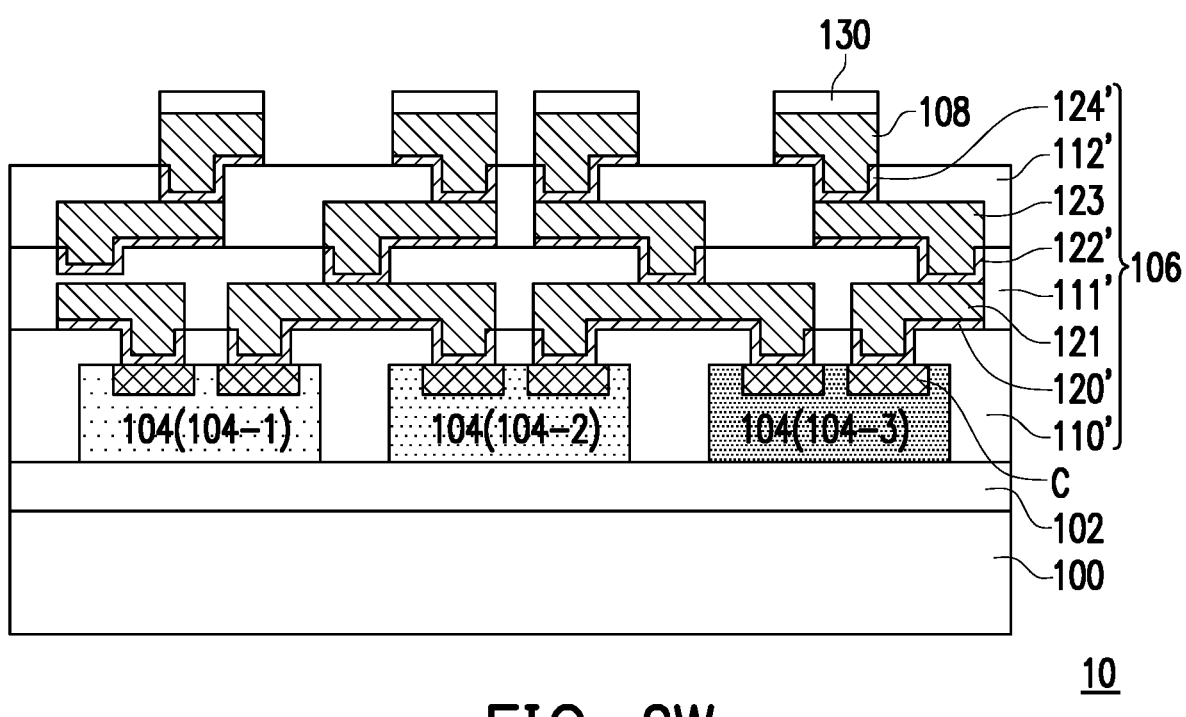

Referring to FIG. 2W, the conductive layer 124 of FIG. 2V is etched by using the protection layer 130 (or the bonding pads 108) as a mask, so as to remove the conductive layer 124 not covered by the protection layer 130 (or the bonding pads 108) and form a patterned conductive layer 124'.

After the process of FIG. 2W, the manufacture of an LED circuit substrate 10 is completed. The LED circuit substrate 10 includes the LED chips 104, the redistribution structure 106, and the bonding pads 108. The LED chips 104 include the contacts C. The redistribution structure 106 is disposed on the LED chips 104 and may include multiple insulating layers (e.g., the patterned insulating layer 110', the patterned insulating layer 111', and the patterned insulating layer 112') and multiple conductive layers (e.g., the patterned conductive layer 120', the conductive layer 121, the patterned conductive layer 122', the conductive layer 123, and the patterned conductive layer 124'). The three insulating layers and the five conductive layers shown in FIG. 2W merely serve as an example. The numbers of the insulating layers and/or the conductive layers may be increased or decreased based on needs, and the same modifications are applicable to the following embodiment. Thus, details in this regard will not be repeated in the following.

In the embodiment, the redistribution structure 106 is directly connected with the contacts C. As shown in FIG. 2W, the conductive layer 120' of the redistribution structure 106 is directly connected with the contacts C. In other words, there is no soldering layer between the conductive layer 120' of the redistribution structure 106 and the contacts C. That is, no solder or other electrical connection medium is required for the electrical connection between the conductive layer 120' of the redistribution structure 106 and the contacts C.

The bonding pads 108 are disposed on the redistribution structure 106 and electrically connected to the contacts C of the LED chips 104 via the redistribution structure 106. As shown in FIG. 2W, the bonding pads 108 are electrically connected with the contacts C of the LED chips 104 via the patterned conductive layer 124', the conductive layer 123, the patterned conductive layer 122', the conductive layer 121, and the patterned conductive layer 120' of the redistribution structure 106.

In some embodiments, the LED circuit substrate 10 may further include the carrier plate 100 and the peelable layer 102. The LED chips 104 are disposed on the carrier plate

100, and the peelable layer 102 is disposed on the carrier plate 100 and located between the LED chips 104 and the carrier plate 100. In addition, the contacts C are away from the peelable layer 102.

In some embodiments, the material of the multiple insulating layers of the redistribution structure 106 may include photosensitive polyimide. Since photosensitive polyimide is flexible, when the LED circuit substrate 10 includes the carrier plate 100 and the peelable layer 102, if the carrier plate 100 is also flexible, the LED circuit substrate 10 may be generally flexible. In some embodiments, although not shown in the drawings, the manufacturing method of the LED circuit substrate may further include removing the peelable layer 102 and the carrier plate 100 after the process of FIG. 2W. In this way, the LED circuit substrate 10 does not include the peelable layer 102 and the carrier plate 100, and the LED circuit substrate 10 is generally flexible. In some embodiments, the carrier plate 100 may be chosen from light-transmissive carrier plates. In this way, the carrier plate 100 may serve as a protective cover.

Since the redistribution structure 106 and the bonding pads 108 are sequentially disposed on the LED chips 104, and the bonding pads 108 are electrically connected with the contacts C of the LED chips 104 via the redistribution structure 106, a chip bonding process may be omitted and, as a result, the yield of transfer may be increased, the defective transfer resulting from the manufacture tolerance of the circuit substrate, the warpage of the circuit substrate, or the positioning tolerance of the mass transfer apparatus, etc., may be suppressed, or the device damage caused by a high-temperature reflow or post-bonding process may be alleviated.

Figure 3:
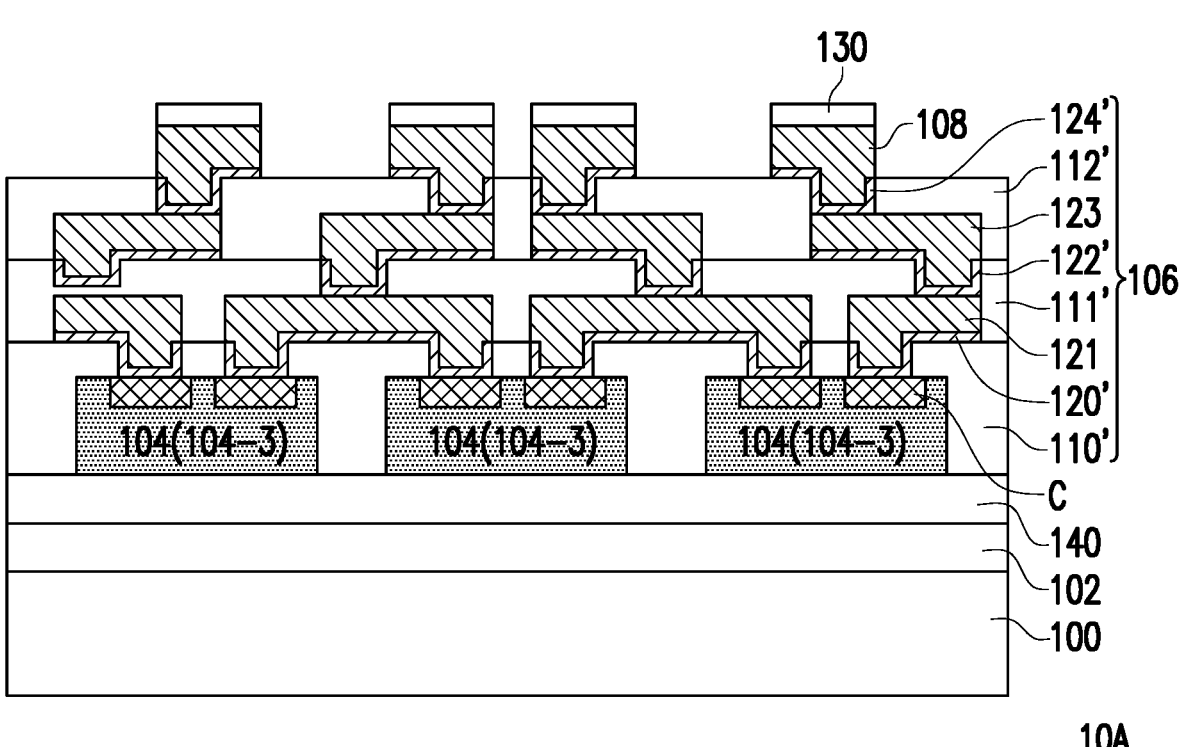
FIG. 3 is a schematic cross-sectional view illustrating an LED circuit substrate according to an embodiment of the invention.

FIG. 3 is a schematic cross-sectional view illustrating an LED circuit substrate according to an embodiment of the invention. Referring to FIG. 3, the main differences of an LED circuit substrate 10A from the LED circuit substrate 10 shown in FIG. 2W are described in the following.

In the LED circuit substrate 10A, the LED chips 104 are the blue LED chips 104-3. In addition, the LED circuit substrate 10A further includes a color conversion layer 140. The color conversion layer 140 is disposed on the carrier plate 100 and located between the LED chips 104 and the peelable layer 102. For example, the color conversion layer 140 is formed on the peelable layer 102 before the LED chips 104 are disposed on the peelable layer 102. The color conversion layer 140 may convert light with a short wavelength (such as blue light) into light with a long wavelength (such as red or green light).

In view of the above, the embodiments of the invention at least exhibit one advantage or effect of the following. In the embodiments of the invention, since the redistribution structure and the bonding pads are sequentially disposed on the LED chips, and the bonding pads are electrically connected with the contacts of the LED chips via the redistribution structure, a chip bonding process may be omitted and, as a result, the yield of transfer may be increased, the defective transfer resulting from the manufacture tolerance of the circuit substrate, the warpage of the circuit substrate, or the positioning tolerance of the mass transfer apparatus, etc., may be suppressed, or the device damage caused by a high-temperature reflow or post-bonding process may be alleviated. In some embodiments, the carrier plate may serve as a protective cover. In some embodiments, the material of the multiple insulating layers of the redistribution structure may include photosensitive polyimide. Accordingly, the LED circuit substrate is generally flexible. In some embodiments, the manufacturing method of the LED circuit substrate may further include removing the peelable layer and the carrier plate.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A manufacturing method of a light emitting diode (LED) circuit substrate, comprising:

forming a peelable layer on a carrier plate;

forming a color conversion layer on the peelable layer, wherein the color conversion layer is configured to convert a light with a short wavelength into a light with a long wavelength;

disposing a plurality of LED chips on the color conversion layer after forming the color conversion layer on the peelable layer, wherein the plurality of LED chips are configured to provide at least one color light, and a plurality of contacts of the plurality of LED chips are away from the peelable layer;

measuring positions of the plurality of contacts of the plurality of LED chips disposed on the peelable layer to obtain contact position data;

providing an exposure circuit diagram according to the contact position data; and sequentially forming a redistribution structure and a plurality of bonding pads on the plurality of LED chips according to the exposure circuit diagram, wherein the plurality of bonding pads are electrically connected with the plurality of contacts of the plurality of LED chips via the redistribution structure.

2. The manufacturing method of the LED circuit substrate as claimed in claim 1, wherein the peelable layer comprises a light debonding layer, a heat debonding layer, or a cold debonding layer.

3. The manufacturing method of the LED circuit substrate as claimed in claim 1, wherein the plurality of LED chips comprise a plurality of red LED chips, a plurality of green LED chips, and a plurality of blue LED chips.

4. The manufacturing method of the LED circuit substrate as claimed in claim 1, wherein the plurality of LED chips are a plurality of blue LED chips.

5. The manufacturing method of the LED circuit substrate as claimed in claim 1, wherein the redistribution structure and the plurality of bonding pads are formed on the plurality of LED chips by a maskless photolithography process.

6. The manufacturing method of the LED circuit substrate as claimed in claim 1, further comprising:

conducting an electrical test on the plurality of LED chips after the contact position data is obtained and before the redistribution structure and the plurality of bonding pads are formed.

7. The manufacturing method of the LED circuit substrate as claimed in claim 1, wherein the redistribution structure comprises a plurality of insulating layers, and a material of the insulating layers comprises photosensitive polyimide.

* * * * *